US012638492B2

(12) United States Patent
Cho et al.

(10) Patent No.: US 12,638,492 B2
(45) Date of Patent: May 26, 2026

(54) SEMICONDUCTOR PACKAGE AND METHOD OF TESTING THE SAME

(71) Applicant: SAMSUNG ELECTRONICS CO., LTD., Suwon-si (KR)

(72) Inventors: Seunghyun Cho, Cheonan-si (KR); Kwanjai Lee, Yongin-si (KR); Jae-Min Jung, Seoul (KR); Jeong-Kyu Ha, Hwaseong-si (KR); Sang-Uk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 860 days.

(21) Appl. No.: 17/816,619

(22) Filed: Aug. 1, 2022

(65) Prior Publication Data

US 2023/0176108 A1 Jun. 8, 2023

(30) Foreign Application Priority Data

Dec. 6, 2021 (KR) ........................ 10-2021-0172799

(51) Int. Cl.
*G01R 31/26* (2020.01)
*G01R 31/27* (2006.01)
(Continued)

(52) U.S. Cl.
CPC ......... *G01R 31/2644* (2013.01); *G01R 31/27* (2013.01); *H10W 70/611* (2026.01);
(Continued)

(58) Field of Classification Search
None
See application file for complete search history.

(56) References Cited

U.S. PATENT DOCUMENTS 6,600,222 B1 7/2003 Levardo
8,119,924 B2 2/2012 Abe et al.
(Continued)

FOREIGN PATENT DOCUMENTS

KR 10-2016-0118807 10/2016
KR 10-2019-0050171 A 5/2019
KR 10-2258746 6/2021

OTHER PUBLICATIONS

Office Action dated Jul. 10, 2025 issued in corresponding Korean Patent Application No. 10-2021-0172799.

*Primary Examiner* — Nilufa Rahim
(74) *Attorney, Agent, or Firm* — Morgan, Lewis & Bockius LLP

(57) ABSTRACT

A semiconductor package includes a base film having a first mount section, a first folding section, a second folding section, and a second mount section. A first semiconductor chip is disposed on the first mount section of the base film. A second semiconductor chip is disposed on the second mount section of the base film. Test pads are disposed on the first or second folding sections of the base film and is connected to each of the first and second semiconductor chips. Connection pads are disposed on the first or second mount sections of the base film and are connected to each of the first and second semiconductor chips. The first and second folding sections vertically overlap each other. The test pads are interposed between and buried by the first and second folding sections.

17 Claims, 17 Drawing Sheets

(51) Int. Cl.
| | | |
|---|---|---|
| *H10W 70/60* | (2026.01) |
| *H10W 70/67* | (2026.01) |
| *H10W 74/10* | (2026.01) |
| *H10W 90/00* | (2026.01) |
| *H10W 90/20* | (2026.01) |

(52) U.S. Cl.
CPC ....... *H10W 70/688* (2026.01); *H10W 74/137* (2026.01); *H10W 90/00* (2026.01); *H10W 90/284* (2026.01)

(56) References Cited

U.S. PATENT DOCUMENTS

| | | | |
|---|---|---|---|
| 9,349,683 | B2 | 5/2016 | Jung et al. |
| 10,306,766 | B2 | 5/2019 | Shi |
| 10,770,383 | B2 | 9/2020 | Im |
| 11,239,172 | B2 | 2/2022 | Lim et al. |
| 2001/0006252 | A1 | 7/2001 | Kim et al. |
| 2005/0095745 | A1* | 5/2005 | Sapir .................... H04N 1/2116 |
| | | | 438/106 |
| 2005/0184376 | A1 | 8/2005 | Salmon |
| 2009/0021666 | A1 | 1/2009 | Chen |
| 2009/0032295 | A1* | 2/2009 | Okajima ................ H05K 1/028 |
| | | | 174/250 |
| 2019/0198411 | A1* | 6/2019 | Horikawa .......... H01L 23/5387 |

* cited by examiner

SEMICONDUCTOR PACKAGE AND METHOD OF TESTING THE SAME

CROSS-REFERENCE TO RELATED APPLICATION

This U.S. nonprovisional application claims priority under 35 U.S.C § 119 to Korean Patent Application No. 10-2021-0172799, filed on Dec. 6, 2021 in the Korean Intellectual Property Office, the disclosure of which is hereby incorporated by reference in its entirety.

TECHNICAL FIELD

The present disclosure relates to a semiconductor package and, more specifically, to a semiconductor package and a method of testing the same.

DISCUSSION OF THE RELATED ART

In the semiconductor industry, integrated circuit packaging technology has been developed to satisfy requirements for small-form-factor devices and high package reliability. For instance, packaging techniques capable of achieving a chip-size package (i.e., a package that is almost as small as the chip itself) are actively being developed to satisfy the requirements for small-form-factor devices, and packaging techniques capable of promoting efficiency in a packaging process and ensuring a high degree of mechanical and electrical reliability of a packaged product have attracted considerable attention.

Chip-on-film (COF) technology is a new type of package that has been developed on a display driver IC with the trend of light, thin, and compact-sized communication device. In COF technology, a semiconductor package becomes highly integrated and complicated to achieve a display device of high resolution.

As a semiconductor packaging process becomes finer and more complicated, defect inspection becomes more important. The inspection of particles on the semiconductor device enhances reliability of the semiconductor device and increases process yield.

SUMMARY

A semiconductor package includes a base film having a first mount section, a first folding section, a second folding section, and a second mount section that are sequentially stacked. A first semiconductor chip is disposed on the first mount section of the base film. A second semiconductor chip is disposed on the second mount section of the base film. A plurality of test pads is disposed on the first and/or second folding section of the base film and is connected to each of the first and second semiconductor chips. A plurality of connection pads is disposed on the first and/or second mount sections of the base film and is connected to each of the first and second semiconductor chips. The first folding section and the second folding section vertically overlap each other. The test pads are interposed between the first folding section and the second folding section.

A semiconductor package includes a base film having a first mount surface, a folding surface, and a second mount surface that are sequentially stacked. The first mount surface, the folding surface, and the second mount surface together constitute a front surface of the base film. A first semiconductor chip is disposed on the first mount surface of the base film. A second semiconductor chip is disposed on the second mount surface of the base film. The first and second semiconductor chips are connected along the front surface of the base film to a plurality of connection patterns. A plurality of test pads is disposed on the folding surface of the base film. The first and second semiconductor chips and the test pads are connected along the front surface of the base film to a plurality of test patterns. A passivation layer is disposed on the front surface of the base film. The passivation layer covers the connection patterns and the test patterns. The folding surface has a first folding surface adjacent to the first mount surface and a second folding surface adjacent to the second mount surface. The base film is folded such that the first folding surface and the second folding surface face each other and the first folding surface and the first mount surface are directed in opposite directions. On the first mount surface, the passivation layer exposes end portions of the connection patterns.

A method of testing a semiconductor package includes providing a semiconductor package including a base film. A top surface of the base film has a first mount surface, a second mount surface, and a folding surface between the first and second mount surfaces. A plurality of semiconductor chips is disposed on the first mount surface and the second mount surface of the base film. A plurality of test pads is disposed on the folding surface of the base film and is connected to the semiconductor chips. A plurality of connection pads is disposed on the first and/or second mount surfaces and is connected to the semiconductor chips. A passivation layer is disposed on the top surface of the base film. The passivation layer exposes the test pads and the connection pads. The test pads are used to perform a test process on the semiconductor package. The base film is folded such that a first folding surface of the folding surface faces a second folding surface of the folding surface. The first folding surface is adjacent to the first mount surface and the second folding surface is adjacent to the second mount surface. After folding the base film, the test pads are buried by the passivation layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 1 is a simplified perspective view showing a semiconductor package according to some embodiments of the present inventive concepts;

Figure 8:
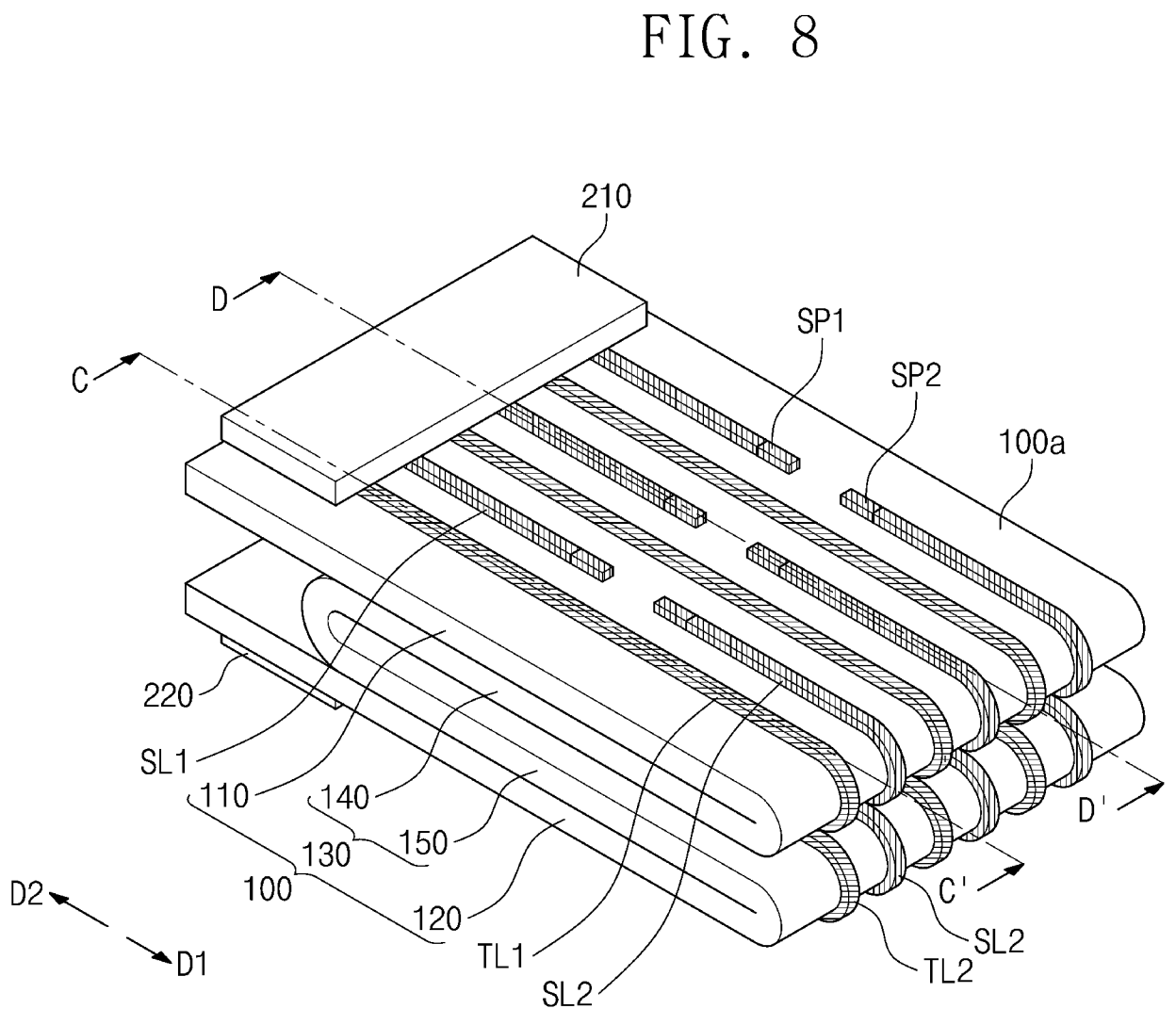

FIG. 8 is a simplified perspective view showing a semiconductor package according to some embodiments of the present inventive concepts;

DETAILED DESCRIPTION OF THE DRAWINGS

Figure 2:
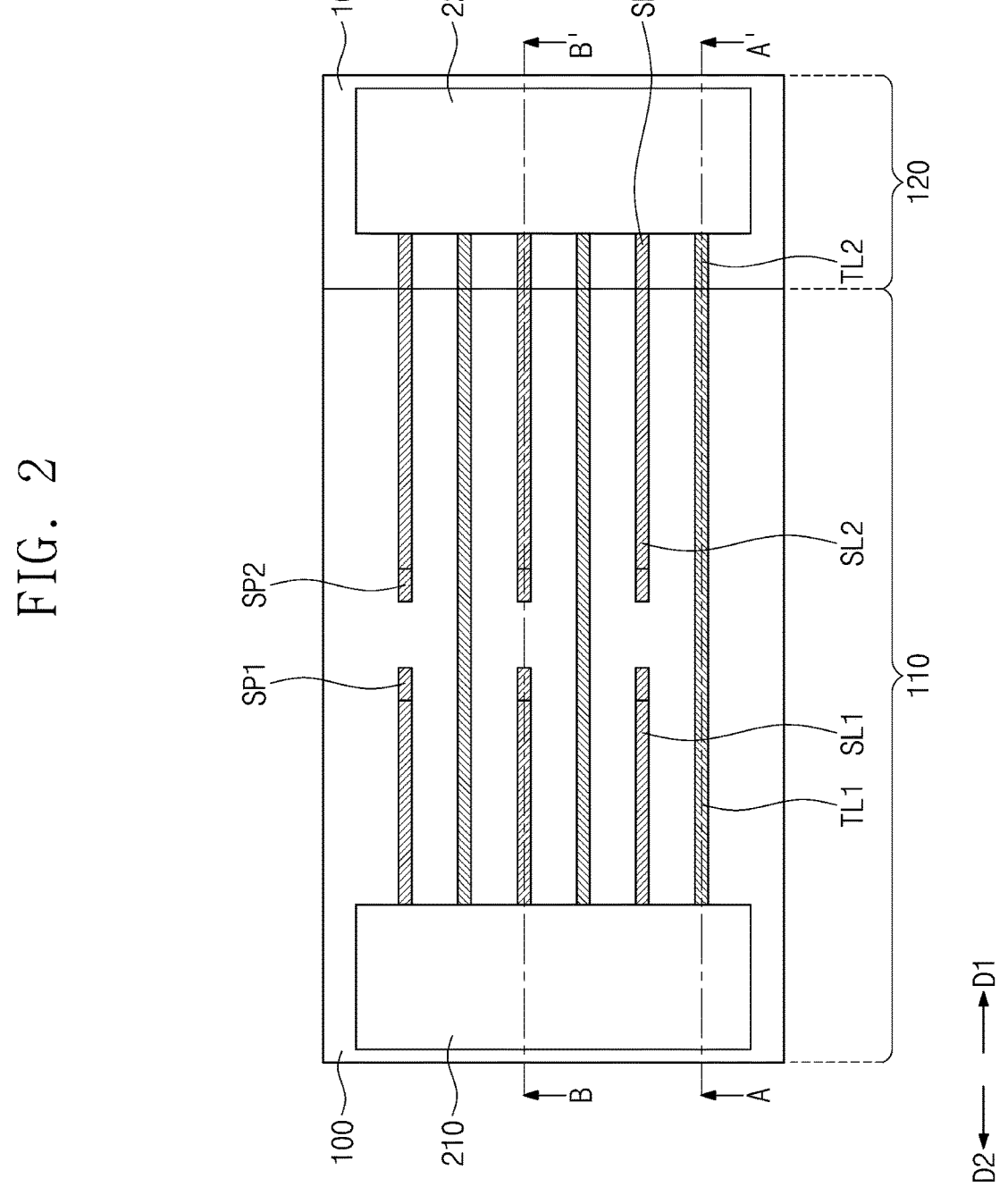
FIGS. 2 and 3 are plan views showing a semiconductor package according to some embodiments of the present inventive concepts.

In describing embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 1:
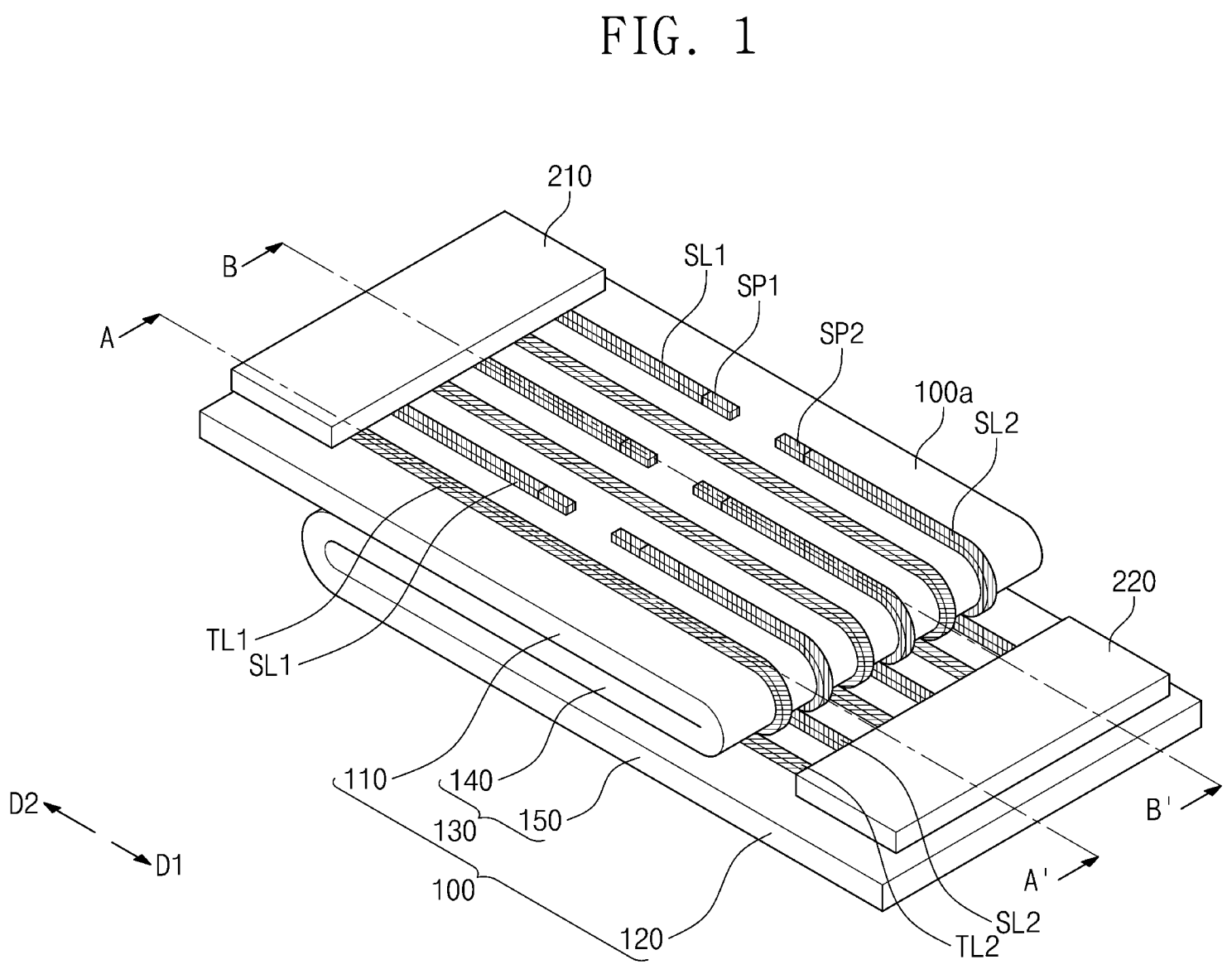
Figure 3:
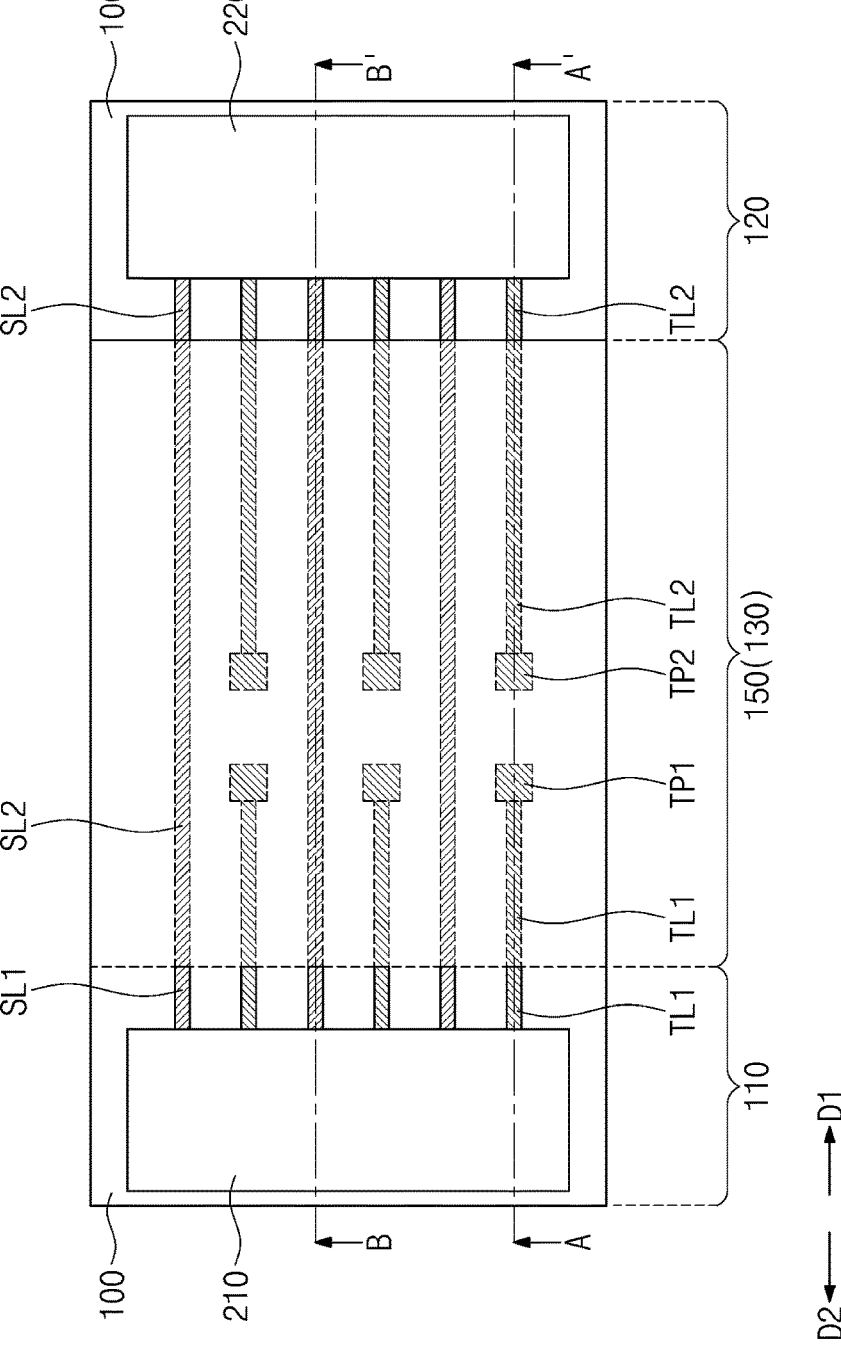
Figure 4:
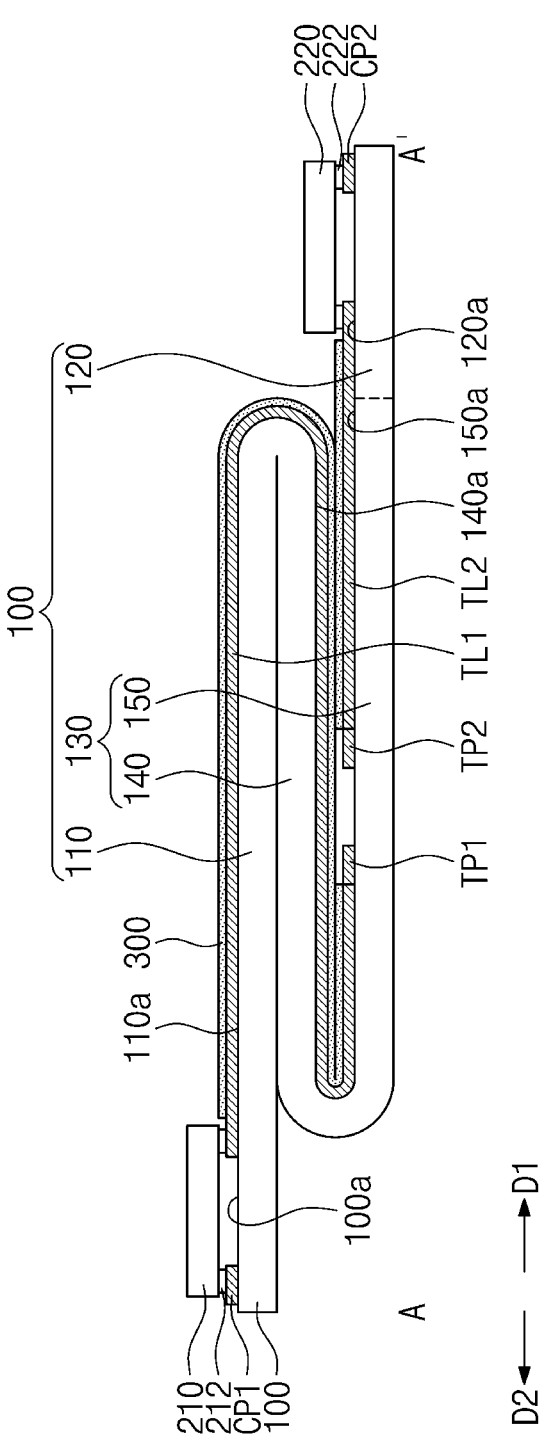
FIGS. 4 to 7 are cross-sectional views showing a semiconductor package according to some embodiments of the present inventive concepts.
Figure 5:
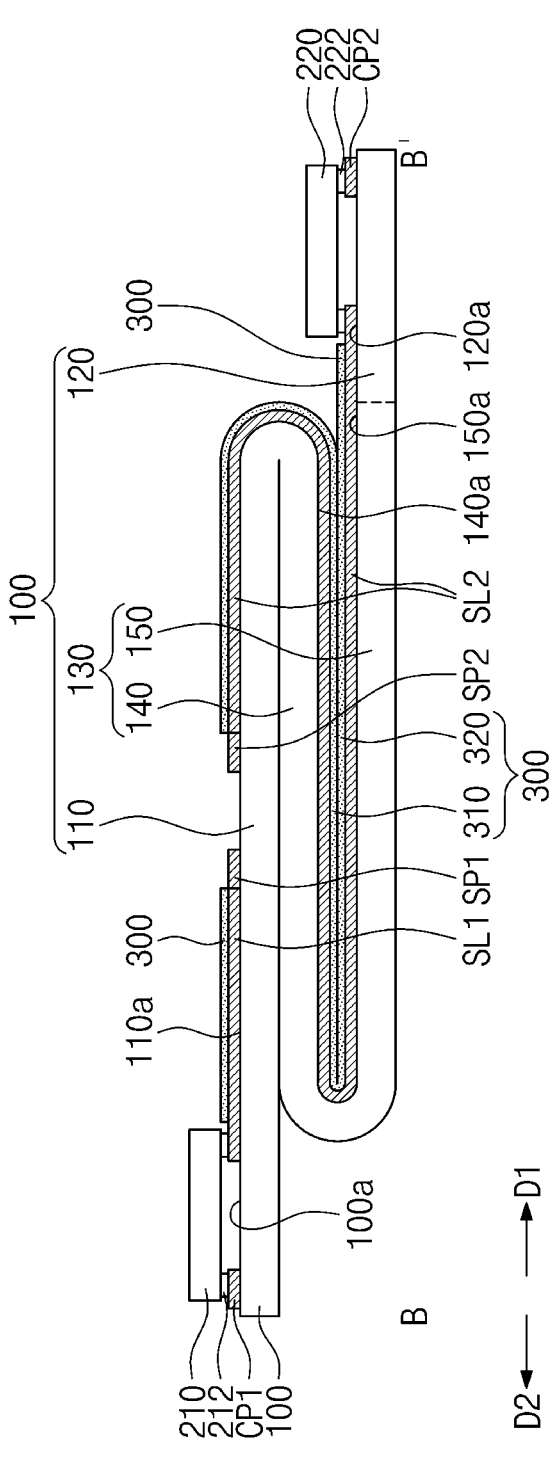

FIG. 1 is a simplified perspective view showing a semiconductor package according to some embodiments of the present inventive concepts. FIGS. 2 and 3 are top plan views showing a semiconductor package according to some embodiments of the present inventive concepts. For convenience of description, some components will be transparently illustrated in FIG. 3. FIGS. 4 and 5 illustrate cross-sectional views respectively taken along lines A-A' and B-B' of FIGS. 1 to 3.

Referring to FIGS. 1 to 5, a base film 100 may be provided. The base film 100 may be a film-type flexible substrate. The base film 100 may include a dielectric material. For example, the base film 100 may include a substrate formed of a flexible material, such as a flexible film formed of polyimide or epoxy-based resin.

The base film 100 may include a first mount section 110, a second mount section 120, and a folding section 130 positioned between the first and second mount sections 110 and 120. The first mount section 110, the second mount section 120, and the folding section 130 may be portions of the base film 100, and the portions may correspond to regions that are distinguished based on purpose of use of the portions. The first mount section 110, the second mount section 120, and the folding section 130 may be sequentially disposed along a primary direction of extension of the base film 100. For example, the first mount section 110 and the second mount section 120 may be disposed on opposite end portions of the base film 100, and the folding section 130 may be disposed on an intermediate portion between the opposite end portions of the base film 100. The folding section 130 may include a first folding section 140 connected to the first mount section 110 and a second folding section 150 connected to the second mount section 120. For example, the first mount section 110, the first folding section 140, the second folding section 150, and the second mount section 120 may be sequentially connected. The first mount section 110 may refer to a region where is mounted a first semiconductor chip 210 which will be discussed below, and the second mount section 120 may refer to a region where is mounted a second semiconductor chip 220 which will be discussed below. The folding section 130 may refer to a region where the base film 100 is folded and neither of the first and second semiconductor chips 210 and 220 are provided.

The base film 100 may be folded so as to have an N shape at a cross section thereof. For example, the first folding section 140 may be positioned below the first mount section 110. In this case, an end portion in a first direction D1 of the first mount section 110 may be connected to an end portion in the first direction D1 of the first folding section 140. The first folding section 140 may be connected to the end portion in the first direction D1 of the first mount section 110. For example, the first folding section 140 may extend from the end portion in the first direction D1 of the first mount section 110 and may run in a second direction D2 below the first mount section 110. The second direction D2 may be opposite to the first direction D1.

The second folding section 150 may be positioned below the first folding section 140. In this case, an end portion in the second direction D2 of the first folding section 140 may be connected to an end portion in the second direction D2 of the second folding section 150. The second folding section 150 may be connected to the end portion in the second direction D2 of the first folding section 140. For example, the second folding section 150 may extend from the end portion in the second direction D2 of the first folding section 140 and may run in the first direction D1 below the first folding section 140. The second folding section 150, the first folding section 140, and the first mount section 110 may vertically overlap each other.

The second mount section 120 may be connected to an end portion in the first direction D1 of the second folding section 150. For example, the second mount section 120 may extend in the first direction D1 from the end portion in the first direction D1 of the second folding section 150. The second mount section 120 may be positioned on one side in the first direction D1 of the folding section 130. Beside the second folding section 150, the second mount section 120 may be located at a same level as that of the second folding section 150. For example, the second mount section 120 might not be covered by either the first folding section 140 or the first mount section 110.

For example, the first mount section 110 may extend in the first direction D1, the first folding section 140 may extend from the end portion in the first direction D1 of the first mount section 110 and may run in the second direction D2 below the first mount section 110, the second folding section 150 may extend from the end portion in the second direction D2 of the first folding section 140 and may run in the first direction D1 below the first folding section 140, and the second mount section 120 may extend from the end portion in the first direction D1 of the second folding section 150 and may run in the first direction D1.

The base film 100 may have a front surface 100a and a rear surface. In this description below, with regard to the base film 100, the term "front surface" may refer to one surface on which semiconductor chips are mounted or on which wiring lines and/or pads are formed, and the term "rear surface" may refer to another surface that stands opposite to the front surface. For example, the front surface 100a of the base film 100 may have a first mount surface 110a of the first mount section 110, a first folding surface 140a of the first folding section 140, a second folding surface 150a of the second folding section 150, and a second mount surface 120a of the second mount section 120. For example, the first mount surface 110a of the first mount section 110, the first folding surface 140a of the first folding section 140, the second folding surface 150a of the second folding section 150, and the second mount surface 120a of the second mount section 120 may each be a portion of the front surface 100a of the base film 100, and may be sequentially connected to each other. The first mount surface 110a, the first folding surface 140a, the second folding surface 150a, and the second mount surface 120a may constitute the front surface 100a of the base film 100.

The front surface 100a of the base film 100 might not be planar based on shape of the base film 100. For example, the base film 100 may have a curved shape at the front surface 100a thereof. In this case, the first folding surface 140a and the second folding surface 150a may face each other.

Therefore, the first folding surface 140a and the second folding surface 150a may be positioned between the first folding section 140 and the second folding section 150, and may be respectively covered with the second folding section 150 and the first folding section 140. The first mount surface 110a and the first folding surface 140a may be directed in opposite directions from each other. Therefore, the first mount surface 110a and the first folding surface 140a may vertically overlap each other, and the first mount surface 110a might not be covered with the folding section 130. The second mount surface 120a and the second folding surface 150a may be aligned in the same direction. As the second mount section 120 is positioned adjacent to the folding section 130, the second mount surface 120a might not be covered with the folding section 130. For example, the second mount surface 120a may be disposed adjacent to the second folding surface 150a, and the second mount surface 120a and the second folding surface 150a may be positioned on a shared plane.

According to some embodiments of the present inventive concepts, the base film 100 may be folded to reduce an area required for a semiconductor package. As a result, the semiconductor package may become small in size. In addition, as the base film 100 is foldable, even though a semiconductor package has a small area, the base film 100 may have a large total area at the front surface 100a on which wiring lines and/or pads are provided. As a result, the semiconductor package may be provided with high integration, large degree of wiring design freedom, and excellent electrical properties.

The base film 100 may have chip pads CP1 and CP2 provided on the front surface 100a of the base film 100. For example, first chip pads CP1 may be disposed on the first mount surface 110a of the first mount section 110. Second chip pads CP2 may be disposed on the second mount surface 120a of the second mount section 120. The first chip pads CP1 and the second chip pads CP2 may be pads upon which semiconductor chips are mounted on the base film 100. The first semiconductor chip 210 and the second semiconductor chip 220 may be mounted on the base film 100. For example, the first semiconductor chip 210 may be mounted on the first chip pads CP1, and the second semiconductor chip 220 may be mounted on the second chip pads CP2. The first and second semiconductor chips 210 and 220 may be mounted in a flip-chip manner. For example, the first semiconductor chip 210 may be provided on its active surface with first chip terminals 212 connected to an integrated circuit of the first semiconductor chip 210, and may be disposed faced-down on the first mound section 110 to allow the first chip terminals 212 to be coupled to the first chip pads CP1. The second semiconductor chip 220 may be provided on its active surface with second chip terminals 222 connected to an integrated circuit of the second semiconductor chip 220, and may be disposed face-down on the second mound section 120 to allow the second chip terminals 222 to be coupled to the second chip pads CP2. Alternatively, the base film 100 may be provided thereon with the first semiconductor chip 210 and the second semiconductor chip 220 that are mounted in a wire bonding manner or any other suitable manner. The second semiconductor chip 220 may be mounted on the second mount surface 120a that is exposed based on a folded shape of the base film 100. Therefore, the second semiconductor chip 220 may be disposed one side in the first direction D1 from the folding section 130, or the first folding section 140 and the second folding section 150, and might not vertically overlap either of the first folding section 140 and the second folding section 150. The first semiconductor chip 210 and the second semiconductor chip 220 may be a display driver IC (DDI). The DDI may be a semiconductor chip that controls pixels to produce colors on a display device. For example, the first semiconductor chip 210 may include a gate IC, and the second semiconductor chip 220 may include a source IC. Alternatively, the first semiconductor chip 210 and the second semiconductor chip 220 may be a transistor such as junction transistor or field effect transistor; a diode such as rectification diode, light emitting diode, or photodiode; an active element such as memory element or integrated circuit; and a passive element such as condenser, resistor, or coil.

Referring to FIGS. 1, 2, and 5, the base film 100 may have connection pads SP1 and SP2 provided on the front surface 100a of the base film 100. For example, first connection pads SP1 and second connection pads SP2 may be disposed on the first mount surface 110a of the first mount section 110. On the first mount surface 110a, the first connection pads SP1 may be disposed adjacent to the first semiconductor chip 210, and the second connection pads SP2 may be spaced apart from the first semiconductor chip 210. For example, the second connection pads SP2 may be arranged on a side in the first direction D1 of the first connection pads SP1, and may each be positioned in the first direction D1 from one of the first connection pads SP1. The first connection pads SP1 and the second connection pads SP2 may be pads on the base film 100 that allow a semiconductor package to be coupled to an external device. For example, the first connection pads SP1 and the second connection pads SP2 may be provided thereon with connection terminals, such as solder balls or solder bumps, through which the semiconductor package is mounted on the external device. For example, so as to drive the semiconductor package, the first connection pads SP1 and the second connection pads SP2 may input and output electrical signals between the semiconductor package and the external device. Even when the base film 100 is folded to have an N shape at its cross section, because the first connection pads SP1 and the second connection pads SP2 are provided on the first mount surface 110a positioned at an outer side of the base film 100, neither the first connection pads SP1 nor the second connection pads SP2 are covered with other portions of the base film 100.

The first connection pads SP1 may be connected to the first semiconductor chip 210, and the second connection pads SP2 may be connected to the second semiconductor chip 220. For example, the base film 100 may be provided on its front surface 100a with first connection patterns SL1 that connect the first semiconductor chip 210 to the first connection pads SP1 and with second connection patterns SL2 that connect the second semiconductor chip 220 to the second connection pads SP2. The first connection patterns SL1 and the second connection patterns SL2 may be lead lines provided on the front surface 100a of the base film 100.

The first connection patterns SL1 may extend in the second direction D2 from the first connection pads SP1 on the first mount surface 110a, thereby being connected to the first chip pads CP1 on the first mount surface 110a. The first connection pads SP1 may be portions of the first connection patterns SL1. For example, the first connection pads SP1 may be end portions of the first connection patterns SL1. Alternatively, the first connection pads SP1 may be formed separately from the first connection patterns SL1. The first chip pads CP1 connected to the first connection patterns SL1 may be portion of the first connection patterns SL1, or may be formed separately from the first connection patterns SL1. The first connection pads SP1 may be connected one-to-one to the first connection patterns SL1. The first semiconductor chip 210 may be electrically connected to the first connection pads SP1 through the first chip pads CP1 and the first connection patterns SL1.

The second connection patterns SL2 may extend from the second connection pads SP2 on the first mount surface 110a, and may be connected to the second chip pads CP2 on the second mount surface 120a, after running along the first folding surface 140a and the second folding surface 150a. The second connection pads SP2 may be portions of the second connection patterns SL2. For example, the second connection pads SP2 may be end portions of the second connection patterns SL2. Alternatively, the second connection pads SP2 may be formed separately from the second connection patterns SL2. The second chip pads CP2 connected to the second connection patterns SL2 may be portions of the second connection patterns SL2 or may be formed separately from the second connection patterns SL2. The second connection pads SP2 may be connected one-to-one to the second connection patterns SL2. The second semiconductor chip 220 may be electrically connected to the second connection pads SP2 through the second chip pads CP2 and the second connection patterns SL2.

Figure 6:
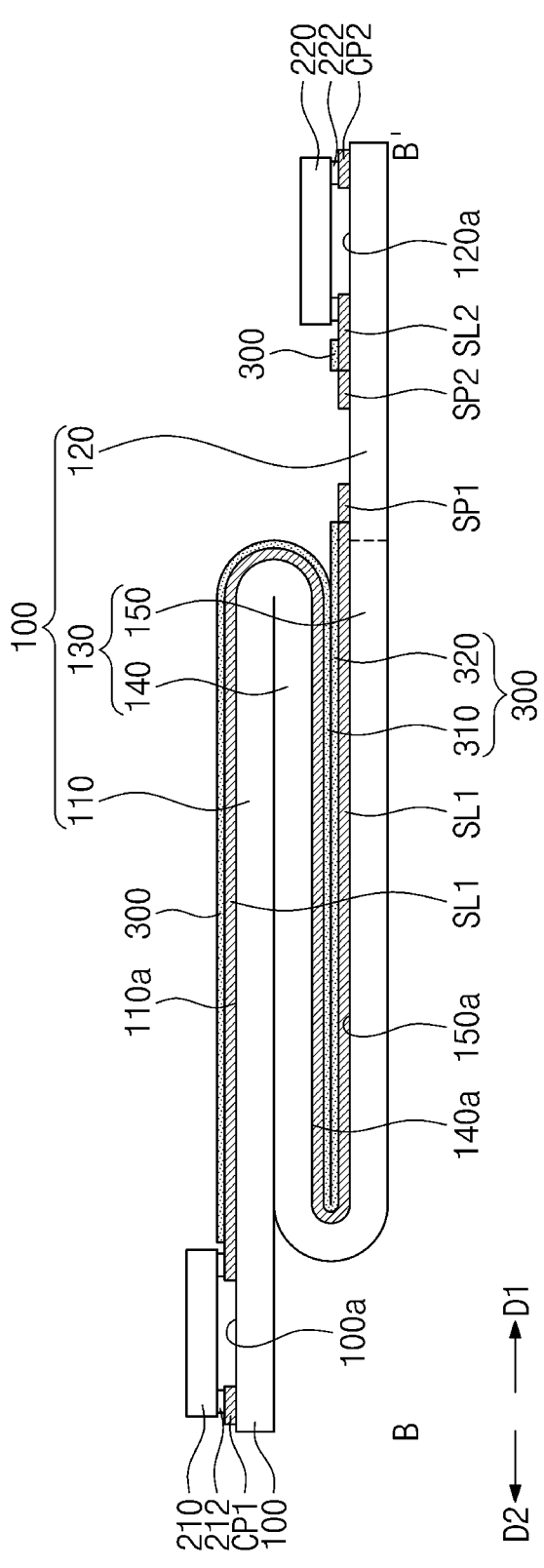

Differently from that shown in FIGS. 2 and 5, the first connection pads SP1 and the second connection pads SP2 may be disposed on the second mount surface 120a of the second mount section 120. As illustrated in FIG. 6, on the second mount surface 120a, the second connection pads SP2 may be disposed adjacent to the second semiconductor chip 220, and the first connection pads SP1 may be spaced apart from the second semiconductor chip 220. For example, the second connection pads SP2 may be arranged on a side in the second direction D2 of the first connection pads SP1, and may each be positioned in the second direction D2 from one of the first connection pads SP1. Even when the base film 100 is folded to have an N shape at its cross section, because the first connection pads SP1 and the second connection pads SP2 are provided on the second mount surface 120a positioned beside the folding section 130 of the base film 100, neither the first connection pads SP1 nor the second connection pads SP2 are covered with other portions of the base film 100. The first connection patterns SL1 may extend from the first connection pads SP1 on the second mount surface 120a, and may be connected to the first chip pads CP1 on the first mount surface 110a after running along the second folding surface 150a and the first folding surface 140a. The second connection patterns SL2 may extend in the first direction D1 from the second connection pads SP2 on the first mount surface 110a, thereby being connected to the second chip pads CP2 on the second mount surface 120a. The following description will focus on the embodiment of FIGS. 2 and 5.

Referring to FIGS. 1, 3, and 4, the base film 100 may have test pads TP1 and TP2 that are provided on the front surface 100a thereof. For example, first test pads TP1 and second test pads TP2 may be disposed on a folding surface of the folding section 130. For example, the first test pads TP1 and the second test pads TP2 may be disposed on the second folding surface 150a of the second folding section 150. On the second folding surface 150a, the second test pads TP2 may be disposed adjacent to the second semiconductor chip 220, and the first test pads TP1 may be spaced apart from the second semiconductor chip 220. For example, the second test pads TP2 may be arranged on a side in the first direction D1 of the first test pads TP1, and may each be positioned in the first direction D1 from one of the first test pads TP1. The first test pads TP1 and the second test pads TP2 may be disposed on the base film 100 that are provided to inspect defects of a semiconductor package during fabrication thereof. This will be further discussed below in detail in describing a method of fabricating and testing a semiconductor package. As the base film 100 is folded, the first test pads TP1 and the second test pads TP2 may be interposed between the first folding section 140 and the second folding section 150. Therefore, the first test pads TP1 and the second test pads TP2 may be covered with the folding section 130 and might not be externally exposed. The first test pads TP1 and the second test pads TP2 may be prevented from being provided with electrical signals due to external terminals or foreign substances, and noise may be inhibited from being inputted to the first semiconductor chip 210 and the second semiconductor chip 220. Thus, it may be possible to provide a semiconductor package with increased drive stability.

The first test pads TP1 may be connected to the first semiconductor chip 210, and the second test pads TP2 may be connected to the second semiconductor chip 220. For example, the base film 100 may be provided on its front surface 100a with first test patterns TL1 that connect the first semiconductor chip 210 to the first test pads TP1 and with second test patterns TL2 that connect the second semiconductor chip 220 to the second test pads TP2. The first test patterns TL1 and the second test patterns TL2 may be lead lines provided on the front surface 100a of the base film 100.

The first test patterns TL1 may extend from the first test pads TP1 on the second folding surface 150a, and may be connected to the first chip pads CP1 on the first mount surface 110a after running along the first folding surface 140a. The first test pads TP1 may be portions of the first test patterns TL1. For example, the first test pads TP1 may be end portions of the first test patterns TL1. Alternatively, the first test pads TP1 may be formed separately from the first test patterns TL1. The first chip pads CP1 connected to the first test patterns TL1 may be portions of the first test patterns TL1, and may be formed separately from the first test patterns TL1. The first test pads TP1 may be connected one-to-one to the first test patterns TL1. The first semiconductor chip 210 may be electrically connected to the first test pads TP1 through the first chip pads CP1 and the first test patterns TL1.

The second test patterns TL2 may extend from the second test pads TP2 on the second folding surface 150a, thereby being connected to the second chip pads CP2 on the second mount surface 120a. The second test pads TP2 may be portions of the second test patterns TL2. For example, the second test pads TP2 may be end portions of the second test patterns TL2. Alternatively, the second test pads TP2 may be formed separately from the second test patterns TL2. The second chip pads CP2 connected to the second test patterns TL2 may be portions of the second test patterns TL2 or may be formed separately from the second test patterns TL2. The second test pads TP2 may be connected one-to-one to the second test patterns TL2. The second semiconductor chip 220 may be electrically connected to the second test pads TP2 through the second chip pads CP2 and the second test patterns TL2.

Figure 7:
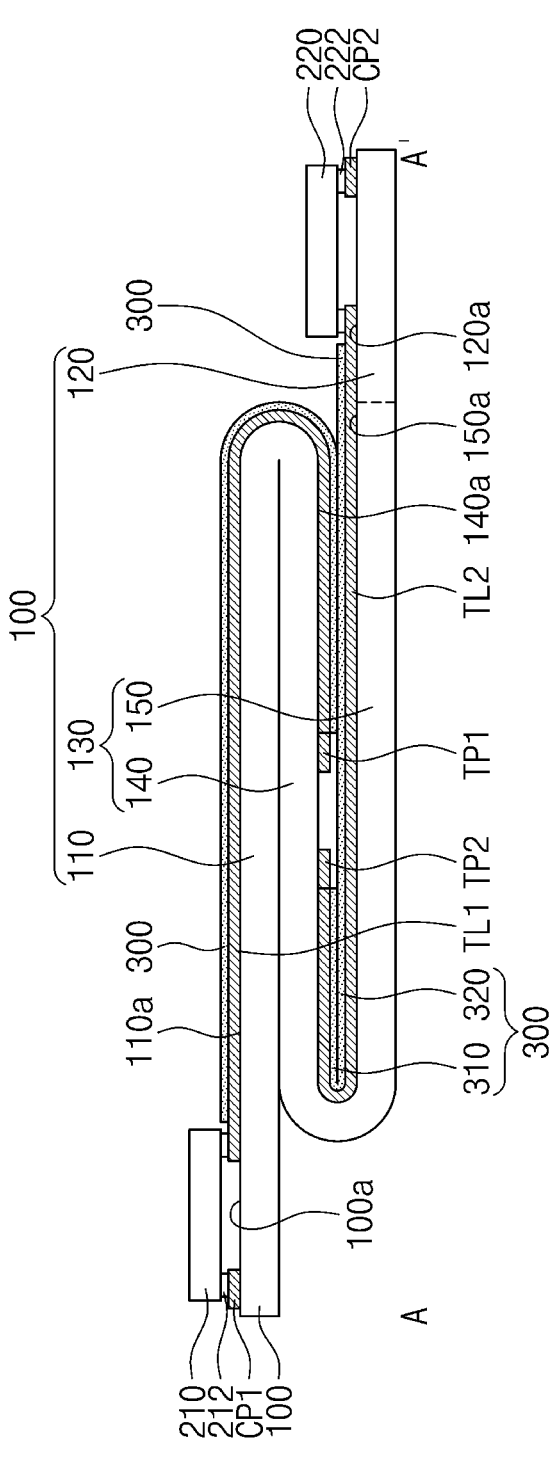

Differently from that shown in FIGS. 3 and 4, the first test pads TP1 and the second test pads TP2 may be disposed on the first folding surface 140a of the first folding section 140. As illustrated in FIG. 7, on the first folding surface 140a, the second test pads TP2 may be arranged on a side in the second direction D2 of the first test pads TP1, and may each be positioned in the second direction D2 from one of the first test pads TP1. As the base film 100 is folded, the first test pads TP1 and the second test pads TP2 may be interposed between the first folding section 140 and the second folding section 150. Therefore, the first test pads TP1 and the second test pads TP2 may be covered with the folding section 130 and might not be externally exposed. The first test patterns TL1 may extend from the first test pads TP1 on the first folding surface 140*a*, thereby being connected to the first chip pads CP1. The second test patterns TL2 may extend from the second test pads TP2 on the first folding surface 140*a*, and may be connected to the second chip pads CP2 on the second mount surface 120*a* after running along the second folding surface 150*a*. The following description will focus on the embodiment of FIGS. 3 and 4.

FIGS. 1 to 5 depict that the first and second connection patterns SL1 and SL2 and the first and second test patterns TL1 and TL2 may be disposed alternately in one direction orthogonal to an extending direction thereof. Based on pad arrangement of the first semiconductor chip 210 and the second semiconductor chip 220, it may be possible to group the first and second connection patterns SL1 and SL2 and/or the first and second test patterns TL1 and TL2. For example, the first and second connection patterns SL1 and SL2 may be disposed adjacent to each other in the one direction, and the first and second test patterns TL1 and TL2 may be disposed adjacent to each other. Alternatively, no limitation is imposed on arrangement of the first and second connection patterns SL1 and SL2 and the first and second test patterns TL1 and TL2.

According to some embodiments of the present inventive concepts, the base film 100 may be provided on its front surface 100*a* with the chip pads CP1 and CP2 for mounting of the first and second semiconductor chips 210 and 220, the connection pads SP1 and SP2 for external connection of the first and second semiconductor chips 210 and 220, the test pads TP1 and TP2 for testing of the first and second semiconductor chips 210 and 220, and wiring patterns SL1, SL2, TL1, and TL2 for electrical connection of the chip pads CP1 and CP2, the connection pads SP1 and SP2, and the test pads TP1 and TP2. Therefore, the base film 100 might not be provided on its rear surface with wiring lines for mounting and connection of the first and second semiconductor chips 210 and 220, and might not require a through connection structure, such as a through electrode or a through via, which is formed to vertically penetrate the base film 100. In this configuration, electrical lines on the base film 100 of a semiconductor package may be shaped like a linear metal pattern, which electrical lines may be easily formed and structurally strong enough to withstand external impact. In addition, the base film 100 may have no hole for the through connection structure, and thus may have increased durability. As a result, a semiconductor package may have increased structural stability.

A passivation layer 300 may be provided on the front surface 100*a* of the base film 100. On the front surface 100*a* of the base film 100, the passivation layer 300 may cover the first connection patterns SL1, the second connection patterns SL2, the first test patterns TL1, and the second test patterns TL2. For example, on the first mount surface 110*a*, the passivation layer 300 may cover the first connection patterns SL1, the second connection patterns SL2, and the first test patterns TL1. In this case, on the first mount surface 110*a*, the passivation layer 300 may expose the first connection pads SP1 and the second connection pads SP2. On the first folding surface 140*a*, the passivation layer 300 may cover the second connection patterns SL2 and the first test patterns TL1. On the second folding surface 150*a*, the passivation layer 300 may cover the second connection patterns SL2, the first test patterns TL1, and the second test patterns TL2. On the second folding surface 150*a*, the passivation layer 300 may expose the first test pads TP1 and the second test pads TP2. On the second mount surface 120*a*, the passivation layer 300 may cover the second connection patterns SL2 and the second test patterns TL2. On the base film 100, the passivation layer 300 may protect the first connection patterns SL1, the second connection patterns SL2, the first test patterns TL1, and the second test patterns TL2.

As shown in FIG. 6, when the second mount surface 120*a* is provided thereon with the first connection pads SP1 and the second connection pads SP2, the passivation layer 300 may cover the first connection patterns SL1 and the first test patterns TL1 on the first mount surface 110*a*. On the second mount surface 120*a*, the passivation layer 300 may cover the first connection patterns SL1, the second connection patterns SL2, and the second test patterns TL2. In this case, on the second mount surface 120*a*, the passivation layer 300 may expose the first connection pads SP1 and the second connection pads SP2.

As shown in FIG. 7, when the first folding surface 140*a* is provided thereon with the first test pads TP1 and the second test pads TP2, the passivation layer 300 may cover the second connection patterns SL2, the first test patterns TL1, and the second test patterns TL2 on the first folding surface 140*a*. On the second folding surface 150*a*, the passivation layer 300 may expose the first test pads TP1 and the second test pads TP2. On the second folding surface 150*a*, the passivation layer 300 may cover the second connection patterns SL2 and the second test patterns TL2. The following description will focus on the embodiment of FIGS. 1 to 5.

The passivation layer 300 may have a first part 310 positioned on the first folding surface 140*a* and a second part 320 positioned on the second folding surface 150*a*, the first part 310 and the second part 320 may face each other based on a folded shape of the base film 100. For example, the first and second parts 310 and 320 of the passivation layer 300 may be in contact with each other between the first folding section 140 and the second folding section 150. In addition, the first test pads TP1 and the second test pads TP2 positioned on the first folding surface 140*a* may be covered with the first part 310 of the passivation layer 300. For example, the first test pads TP1 and the second test pads TP2 may be buried in the passivation layer 300 between the first folding section 140 and the second folding section 150. Therefore, neither of the first and second test pads TP1 and TP2 may be externally exposed. The passivation layer 300 may include a non-conductive adhesive material. Thus, the first and second parts 310 and 320 of the passivation layer 300 may be attached to each other, and the first folding section 140 and the second folding section 150 may be more rigidly bonded to each other. As a result, a semiconductor package may have increased structural stability.

Figure 9:
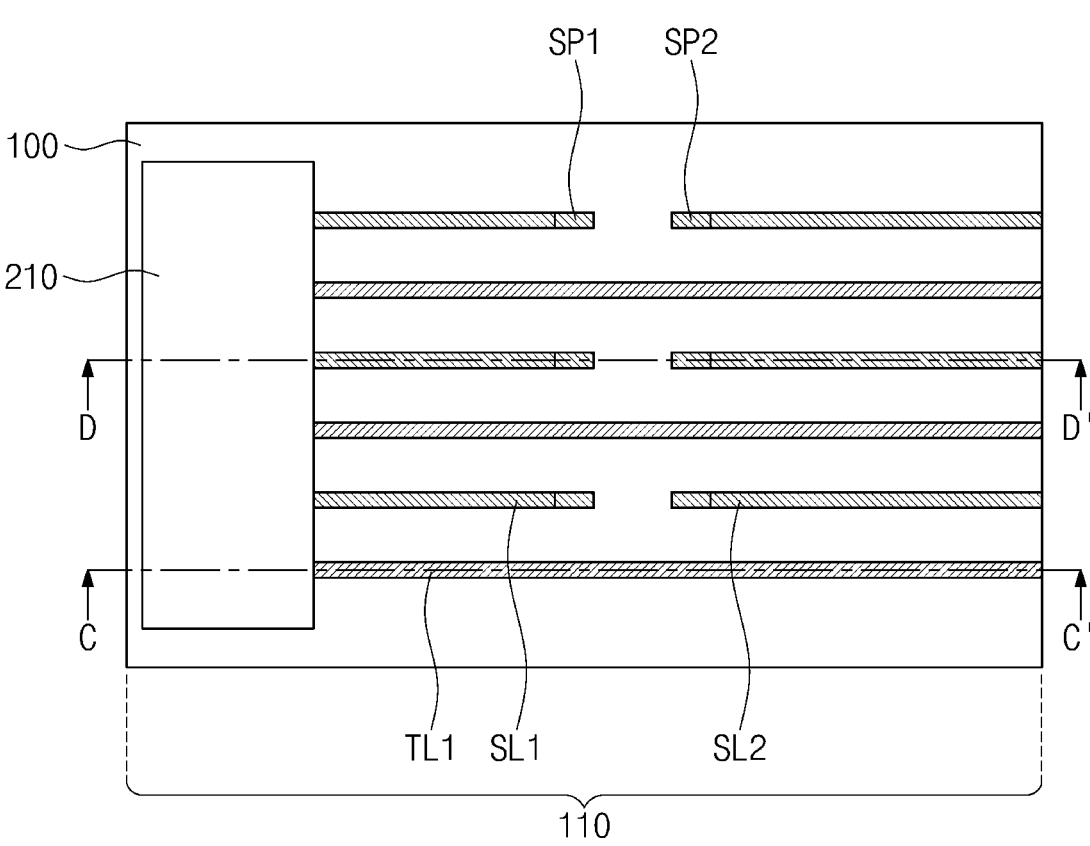
FIGS. 9 and 10 are plan views showing a semiconductor package according to some embodiments of the present inventive concepts.
Figure 10:
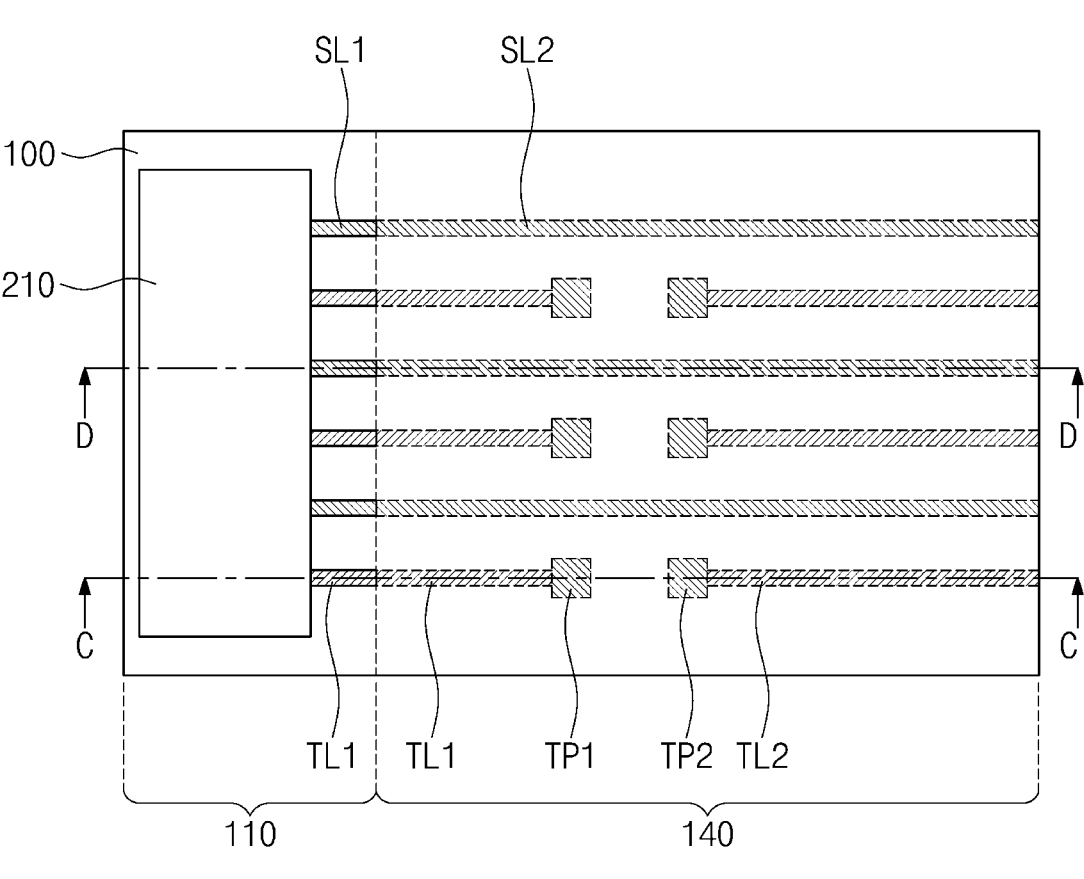
Figure 11:
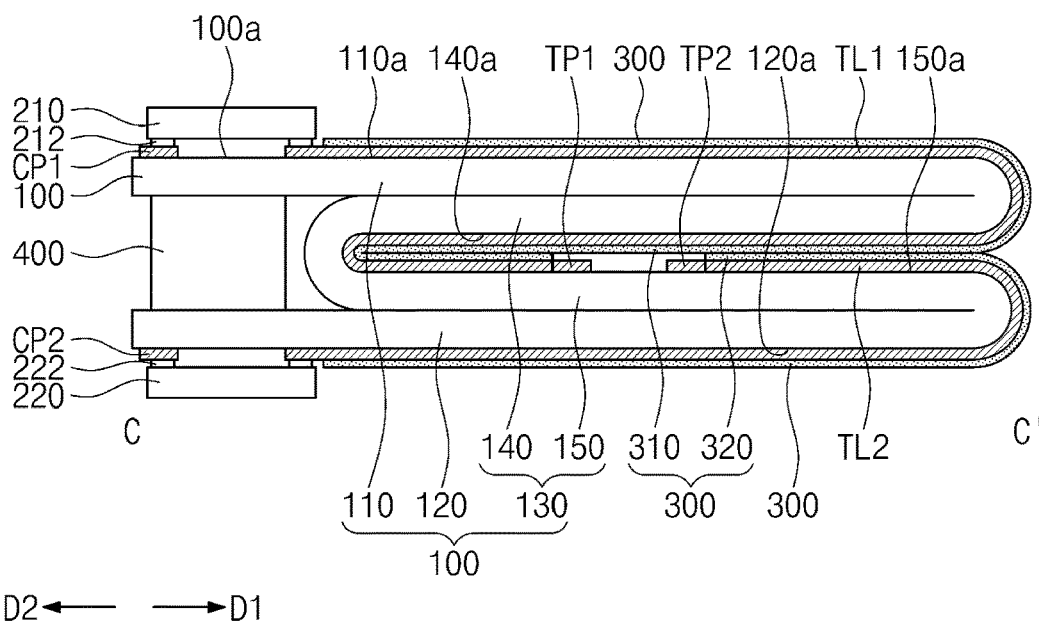
FIGS. 11 and 12 are cross-sectional views showing a semiconductor package according to some embodiments of the present inventive concepts.
Figure 12:
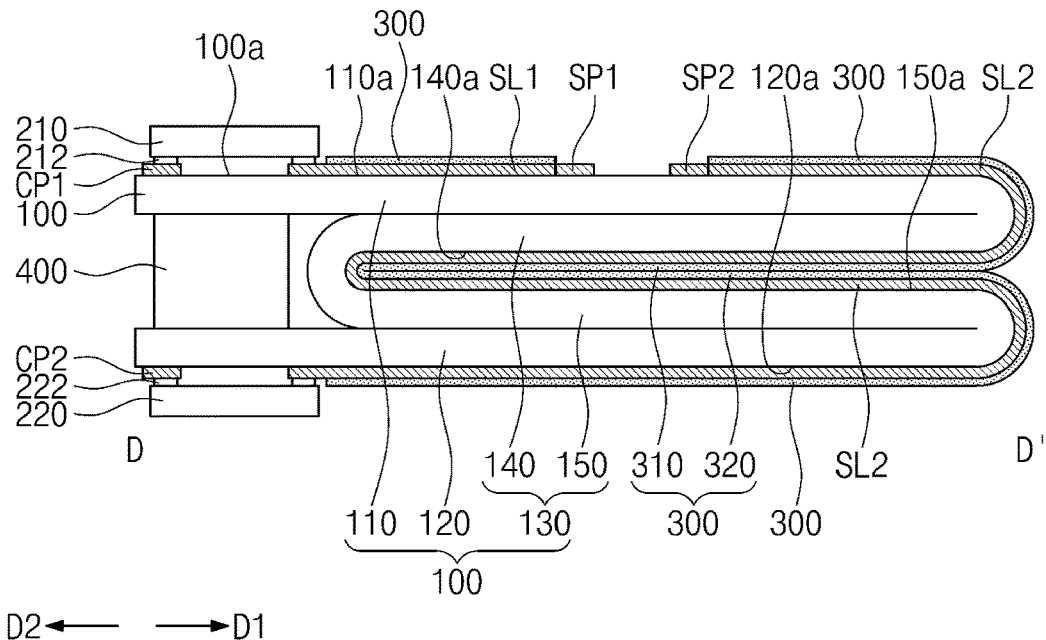

FIG. 8 illustrates a simplified perspective view showing a semiconductor package according to some embodiments of the present inventive concepts. FIGS. 9 and 10 illustrate top plan views showing a semiconductor package according to some embodiments of the present inventive concepts. For convenience of description, some components will be transparently illustrated in FIG. 10. FIGS. 11 and 12 illustrate cross-sectional views showing a semiconductor package according to some embodiments of the present inventive concepts. FIG. 11 corresponds to a cross section taken along line C-C' of FIGS. 8 to 10. FIG. 12 corresponds to a cross section taken along line D-D' of FIG. 10. In the embodiments that follow, to the extent that a detailed description of technical features of an element are not described, it may be understood that the element is at least similar to a corresponding element that has been described above with reference to FIGS. 1 to 7. The same reference numerals may be allocated to the components the same as or similar to those of the semiconductor package discussed above.

The base film 100 may be folded to have an M shape at a cross section thereof. For example, the first folding section 140 may be positioned below the first mount section 110. In this case, an end portion in the first direction D1 of the first mount section 110 may be connected to an end portion in the first direction D1 of the first folding section 140. Thus, the first folding section 140 may be connected to the end portion in the first direction D1 of the first mount section 110. For example, the first folding section 140 may extend from the end portion in the first direction D1 of the first mount section 110 and may run in the second direction D2 below the first mount section 110. The second direction D2 may be opposite to the first direction D1.

The second folding section 150 may be positioned below the first folding section 140. In this case, an end portion in the second direction D2 of the first folding section 140 may be connected to an end portion in the second direction D2 of the second folding section 150. The second folding section 150 may be connected to the end portion in the second direction D2 of the first folding section 140. For example, the second folding section 150 may extend from the end portion in the second direction D2 of the first folding section 140 and may run in the first direction D1 below the first folding section 140.

The second mount section 120 may be positioned below the second folding section 150. An end portion in the first direction D1 of the second folding section 150 may be connected to an end portion in the first direction D1 of the second mount section 120. For example, the second mount section 120 may be connected to the end portion in the first direction D1 of the second folding section 150. For example, the second mount section 120 may extend from the end portion in the first direction D1 of the second folding section 150 and may run in the second direction D2 below the second folding section 150. The second mount section 120, the second folding section 150, the first folding section 140, and the first mount section 110 may vertically overlap each other.

For example, the first mount section 110 may extend in the first direction D1, the first folding section 140 may extend from the end portion in the first direction D1 of the first mount section 110 and may run in the second direction D2 below the first mount section 110, the second folding section 150 may extend from the end portion in the second direction D2 of the first folding section 140 and may run in the first direction D1 below the first folding section 140, and the second mount section 120 may extend from the end portion in the first direction D1 of the second folding section 150 and may run in the second direction D2.

The base film 100 may have a front surface 100a and a rear surface. For example, the front surface 100a of the base film 100 may have a first mount surface 110a of the first mount section 110, a first folding surface 140a of the first folding section 140, a second folding surface 150a of the second folding section 150, and a second mount surface 120a of the second mount section 120.

The front surface 100a of the base film 100 might not be planar based on shape of the base film 100. For example, the base film 100 may have a curved shape at the front surface 100a thereof. In this case, the first folding surface 140a and the second folding surface 150a may face each other. Therefore, the first folding surface 140a and the second folding surface 150a may be positioned between the first folding section 140 and the second folding section 150, and may be respectively covered with the second folding section 150 and the first folding section 140. The first mount surface 110a and the first folding surface 140a may be directed in opposite directions from each other. Therefore, the first mount surface 110a and the first folding surface 140a may vertically overlap each other, and the first mount surface 110a might not be covered with the folding section 130. The second mount surface 120a and the second folding surface 150a may be directed in opposite directions from each other. Therefore, the second mount surface 120a and the second folding surface 150a may vertically overlap each other, and the second mount surface 120a might not be covered with the folding section 130.

According to some embodiments of the present inventive concepts, the base film 100 may be folded multiple times to reduce an area required for a semiconductor package. As a result, the semiconductor package may become small in size.

The first mount section 110 and the second mount section 120 may have their end portions that protrude in the second direction D2 from the folding section 130. Thus, the folding section 130 might not be provided between the end portion of the first mount section 110 and the end portion of the second mount section 120, and there may be an interval between the end portion of the first mount section 110 and the end portion of the second mount section 120.

A supporter 400 may be interposed between the end portion of the first mount section 110 and the end portion of the second mount section 120. Between the end portion of the first mount section 110 and the end portion of the second mount section 120, the supporter 400 may support the first mount section 110 and the second mount section 120. The supporter 400 may include a dielectric material or a dielectric adhesion layer. The supporter 400 might not be provided as needed. For example, neither the end portion of the first mount section 110 nor the end portion of the second mount section 120 may protrude in the second direction D2 from the folding section 130.

Figure 13:
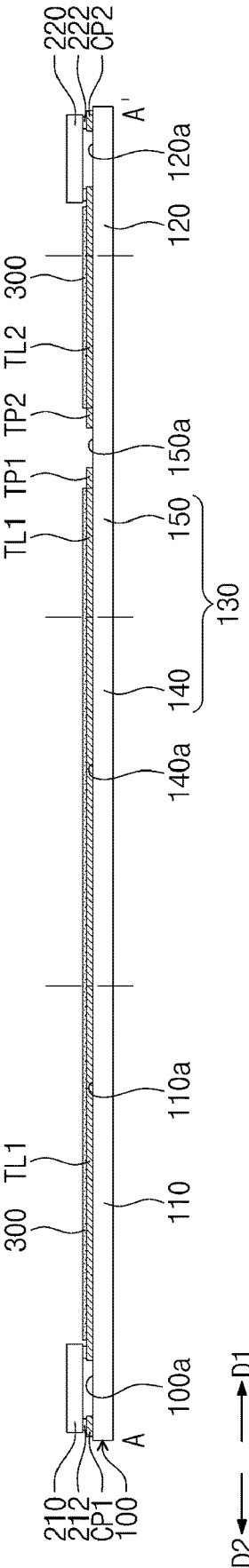
FIGS. 13 to 18 are cross-sectional views showing a method of fabricating and testing a semiconductor package according to some embodiments of the present inventive concepts.
Figure 14:
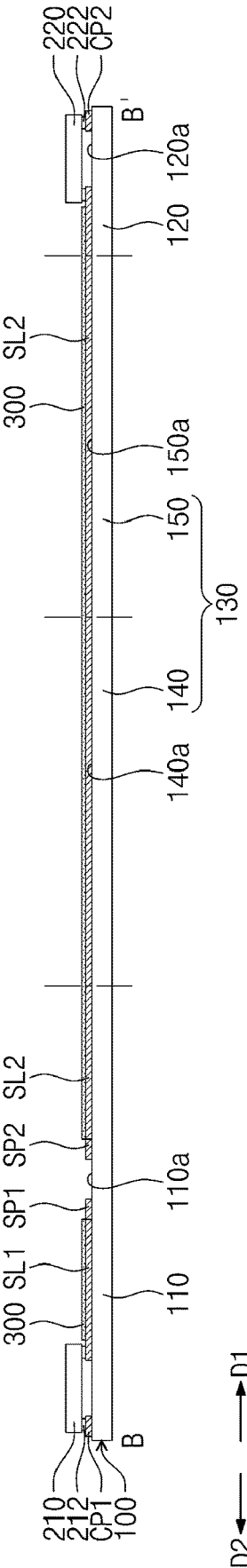
Figure 15:
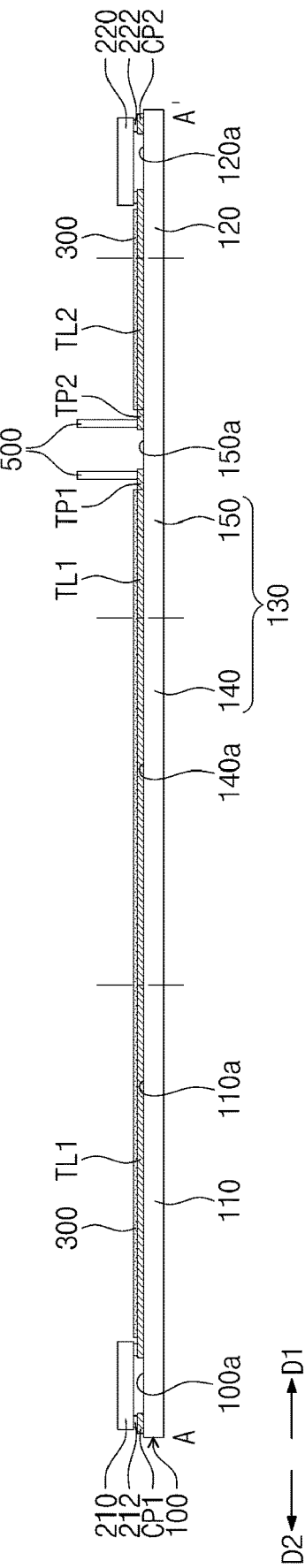
Figure 16:
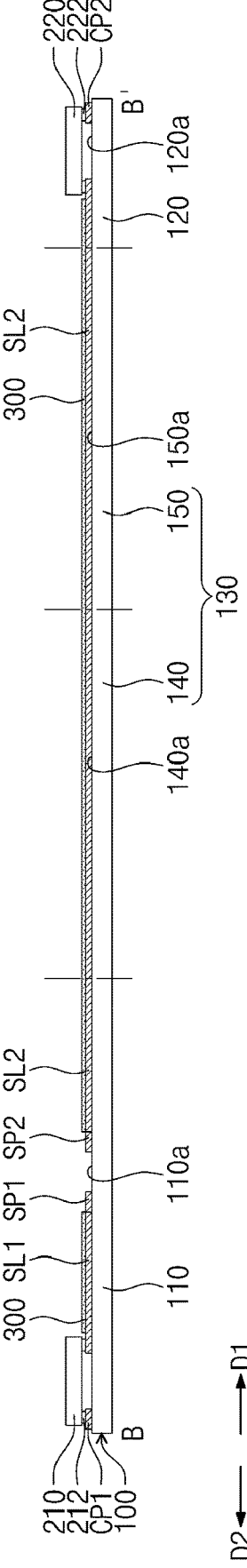
Figure 17:
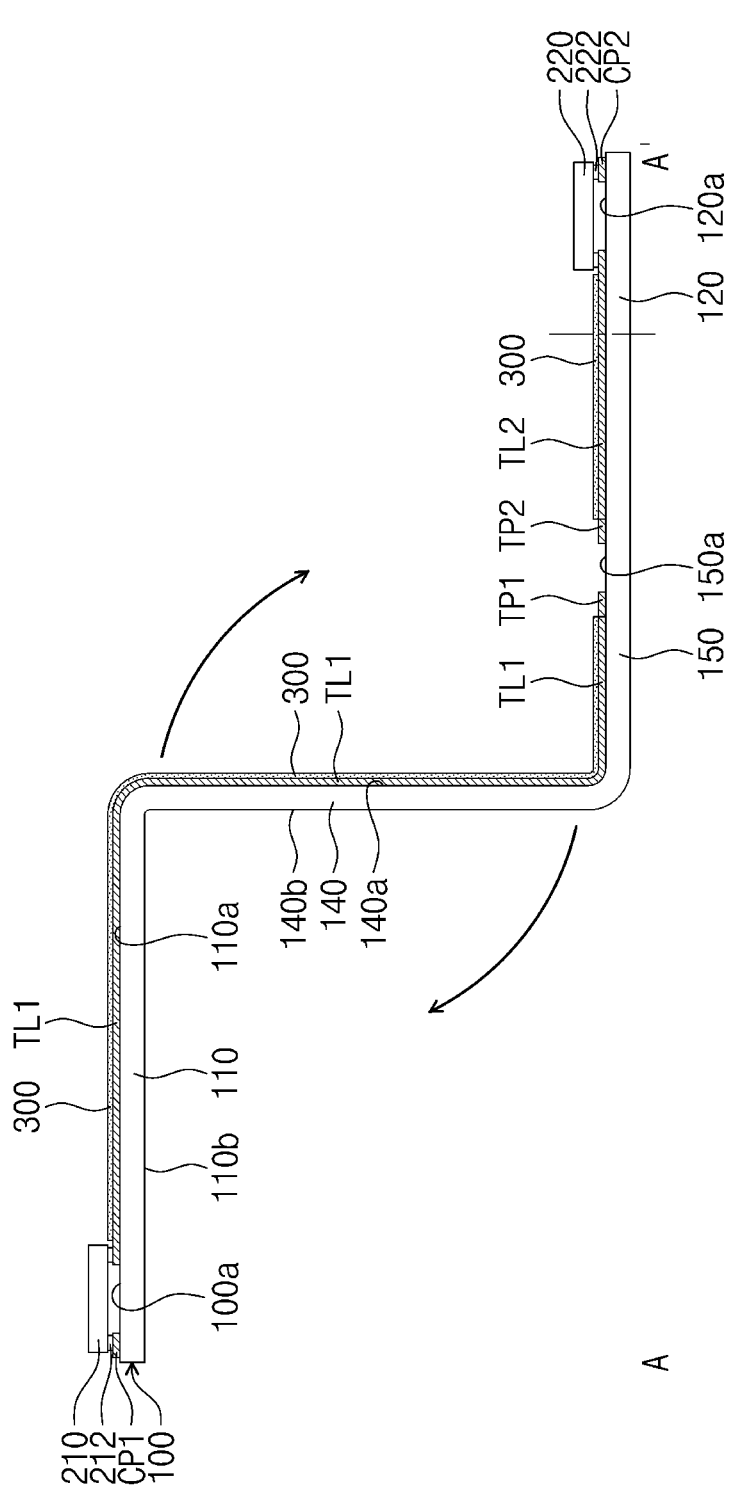
Figure 18:
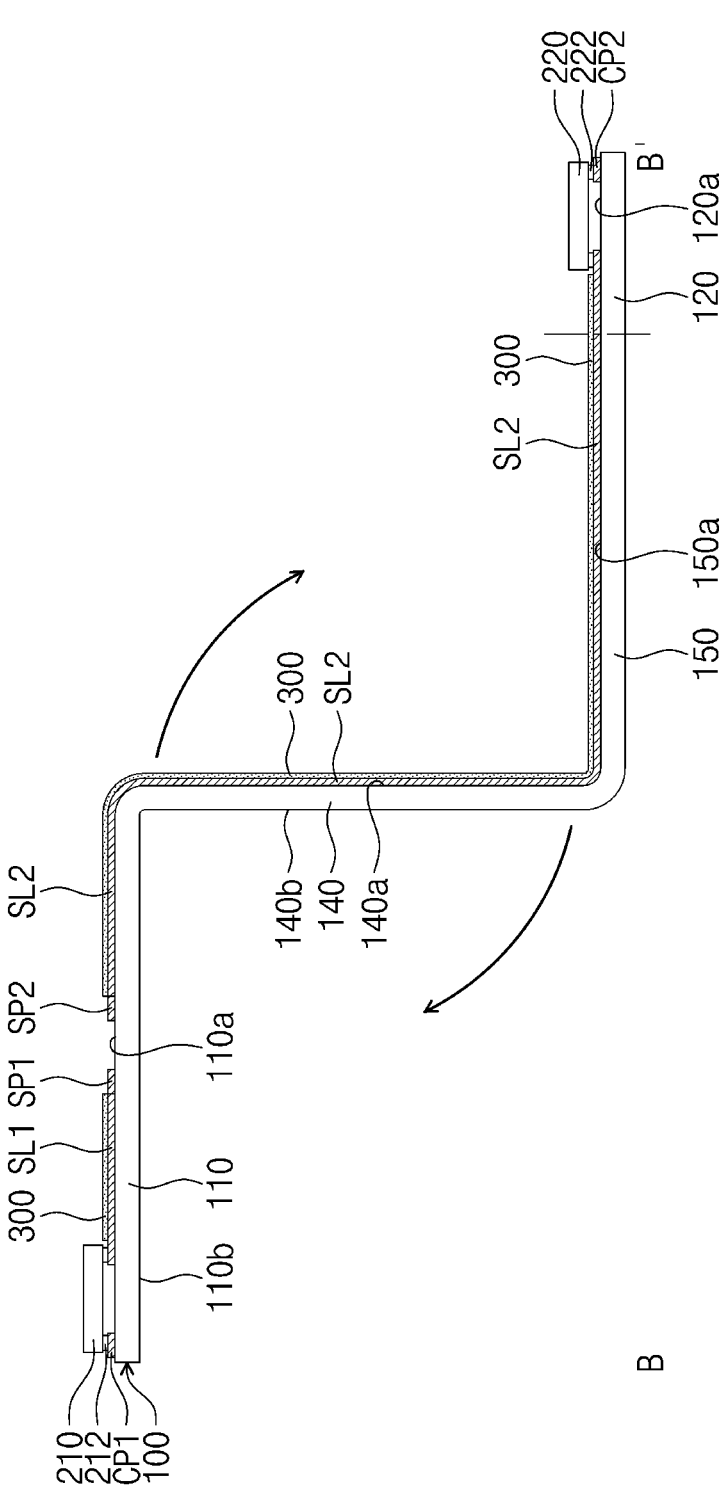

FIGS. 13 to 18 illustrate cross-sectional views showing a method of fabricating and testing a semiconductor package according to some embodiments of the present inventive concepts. FIGS. 13, 15, and 17 correspond to cross sections taken along line A-A' of FIGS. 1 to 3. FIGS. 14, 16, and 18 correspond to cross sections taken along line B-B' of FIGS. 1 to 3.

Referring to FIGS. 1 to 13, a base film 100 may be provided. The base film 100 may be a film-type flexible substrate. The base film 100 may include a dielectric material. The base film 100 may have a flat plate shape.

The base film 100 may include a first mount section 110, a second mount section 120, and a folding section 130 positioned between the first and second mount sections 110 and 120. The first mount section 110, the folding section 130, and the second mount section 120 may be sequentially disposed along a first direction D1. For example, the first mount section 110 and the second mount section 120 may be disposed on opposite end portions in the first and second directions D1 and D2 of the base film 100, and the folding section 130 may be disposed on an intermediate portion between the opposite end portions of the base film 100. The folding section 130 may include a first folding section 140 connected to the first mount section 110 and a second folding section 150 connected to the second mount section 120. For example, the first mount section 110, the first folding section 140, the second folding section 150, and the second mount section 120 may be sequentially connected.

A conductive pattern may be formed on the base film 100. For example, after the formation of the conductive layer on the base film 100, the conductive layer may be patterned. The patterning process may form first chip pads CP1 and first and second connection pads SP1 and SP2 on a first mount surface 110a of the first mount section 110, first and second test pads TP1 and TP2 on a second folding surface 150a of the second folding section 150, second chip pads CP2 on a second mount surface 120a of the second mount section 120, first connection patterns SL1 that connect the first chip pads CP1 to the first connection pads SP1, first test patterns TL1 that connect the first chip pads CP1 to the first test pads TP1, second connection patterns SL2 that connect the second chip pads CP2 to the second connection pads SP2, and second test patterns TL2 that connect the second chip pads CP2 to the second test pads TP2. The conductive layer may include metal, such as copper (Cu).

A passivation layer 300 may be formed on a front surface 100a of the base film 100. For example, a dielectric material may be coated or deposited on the front surface 100a of the base film 100, and then the dielectric material may be cured to form the passivation layer 300. The passivation layer 300 may be patterned to expose the first chip pads CP1, the second chip pads CP2, the first connection pads SP1, the second connection pads SP2, the first test pads TP1, and the second test pads TP2.

First and second semiconductor chips 210 and 220 may be mounted on the base film 100. For example, the first semiconductor chip 210 may be mounted on the first chip pads CP1, and the second semiconductor chip 220 may be mounted on the second chip pads CP2. The first and second semiconductor chips 210 and 220 may be mounted in a flip-chip manner. For example, the first semiconductor chip 210 may be aligned to allow first chip terminals 212 to rest on the first chip pads CP1, and then the first chip terminals 212 may be connected to the first chip pads CP1. The second semiconductor chip 220 may be aligned to allow second chip terminals 222 to rest on the second chip pads CP2, and then the second chip terminals 222 may be connected to the second chip pads CP2.

Referring to FIGS. 1, 15, and 16, to test electrical properties of a semiconductor package, a measurement apparatus may be provided on the second folding surface 150a of the second folding section 150 included in the base film 100. The measurement apparatus may be equipped with probes 500. The probes 500 may be in contact with the first test pads TP1 and the second test pads TP2 disposed on the second folding surface 150a of the second folding section 150.

According to some embodiments of the present inventive concepts, as the test pads TP1 and TP2 may be exposed on the front surface 100a of the base film 100 after the base film 100 becomes to have a plate shape, it may be easy to connect the measurement apparatus to the test pads TP1 and TP1 and to test characteristics of a semiconductor package.

Referring to FIGS. 1, 17, and 18, the base film 100 may be foldable. For example, the base film 100 may bend at a boundary between the first mount section 110 and the first folding section 140. In this case, a first rear surface 110b of the first mount section 110 may become closer to a second rear surface 140b of the first folding section 140. The first mount section 110 may have a surface, or the first rear surface 110b, which is opposite to the first mount surface 110a. The first folding section 140 may have a surface, or the second rear surface 140b, which is opposite to the first folding surface 140a. The first rear surface 110b and the second rear surface 140b may be portions of a rear surface of the base film 100. The base film 100 may bend at a boundary between the second mount section 120 and the second folding section 150. In this case, the second folding surface 150a of the second folding section 150 may become closer to the first folding surface 140a of the first folding section 140.

According to some embodiments, the base film 100 may also bend at a boundary between the second mount section 120 and the second folding section 150. In this case, a third rear surface of the second mount section 120 may become closer to a fourth rear surface of the second folding section 150. The second mount section 120 may have a surface, or the third rear surface, which is opposite to the second mount surface 120a. The second folding section 150 may have a surface, or the fourth rear surface, which is opposite to the second folding surface 150a. The first rear surface 110b, the second rear surface 140b, the third rear surface, and the fourth rear surface may be portions of the rear surface of the base film 100. Through the processes described above, a semiconductor package may be fabricated as illustrated in FIGS. 8 to 12. The following description will focus on the embodiment of FIGS. 17 and 18.

Referring back to FIGS. 1 to 5, when a folding process is continuously performed on the base film 100, the first rear surface 110b of the first mount section 110 may become in contact with the second rear surface 140b of the first folding section 140, and the second folding surface 150a of the second folding section 150 may become adjacent to the first folding surface 140a of the first folding section 140. The passivation layer 300 may have a first part 310 on the first folding surface 140a and a second part 320 on the second folding surface 150a, which first and second parts 310 and 320 may be in contact with each other. Therefore, the passivation layer 300 may attach the first folding section 140 and the second folding section 150 to each other, and may encapsulate the first and second test pads TP1 and TP2 positioned between the first folding section 140 and the second folding section 150.

According to some embodiments of the present inventive concepts, after a test process of a semiconductor package, the base film 100 may be folded to allow the first and second test pads TP1 and TP2 to be covered without being externally exposed. Therefore, after the test process in which the first and second test pads TP1 and TP2 are used to test the semiconductor package, a separate cutting process might not be needed to remove the first and second test pads TP1 and TP2 and the semiconductor package may be prevented from being contaminated with impurities that may otherwise contaminate the semiconductor package during the cutting process. Accordingly, it may be possible to provide a method of fabricating and testing a semiconductor package with less occurrence of failure.

In a semiconductor package, according to some embodiments of the present inventive concepts, a base film may be folded to reduce an area required for the semiconductor package. Therefore, the semiconductor package may become small in size. In addition, the base film may have a large total area at its front surface on which wiring lines and/or pads are provided. As a result, the semiconductor package may have high integration, increased degree of wiring freedom, and enhanced electrical properties.

Moreover, as the base film is foldable, test pads may be interposed between and covered with folding sections, such that the test pads are not externally exposed. The test pads may be prevented from being provided with electrical signals due to external terminals or foreign substances, and noise may be inhibited from being inputted to semiconductor chips. Accordingly, the semiconductor package may have increased drive stability.

Furthermore, pads and wiring lines may all be provided on a front surface of the base film but not on a rear surface of the base film, and no through connection structure vertically penetrate the base film might be needed. In this configuration, electrical lines may be easily formed and structurally strong enough to withstand external impact. In addition, the base film might not have a hole for the through connection structure, and thus may have increased durability. As a result, the semiconductor package may have increased structural stability.

In a method of fabricating and testing a semiconductor package according to some embodiments of the present inventive concepts, after a test process of the semiconductor package, the base film may be folded to allow the test pads to be covered without being externally exposed. Therefore, after the test process, a separate cutting process might not be needed to remove the test pads, and the semiconductor package may be prevented from being contaminated with impurities occurring in the cutting process. Accordingly, it may be possible to provide a method of fabricating and testing a semiconductor package with less occurrence of failure.

Although some embodiments of the present disclosure have been described in connection with the accompanying drawings, it will be understood by one of ordinary skill in the art that variations in form and detail may be made therein without departing from the spirit and essential feature of the present disclosure.

What is claimed is:

1. A semiconductor package, comprising:
   a base film including a first mount section, a first folding section, a second folding section, and a second mount section that are sequentially arranged;
   a first semiconductor chip disposed on the first mount section of the base film;
   a second semiconductor chip disposed on the second mount section of the base film;
   a plurality of test pads disposed on the first and/or second folding sections of the base film and connected to each of the first and second semiconductor chips;
   a plurality of connection pads disposed on the first and/or second mount sections of the base film and connected to each of the first and second semiconductor chips;
   a plurality of test patterns through which the first and second semiconductor chips and the plurality of test pads are connected along a front surface of the base film; and
   a passivation layer disposed on the front surface of the base film, the passivation layer covering the plurality of test patterns,
   wherein the first folding section and the second folding section vertically overlap each other, and wherein the plurality of test pads is interposed between the first folding section and the second folding section.

2. The semiconductor package of claim 1, wherein the base film is folded to have an N shape or M shape at a cross section of the base film.

3. The semiconductor package of claim 1, wherein the first mount section is disposed on and vertically overlaps the first folding section, and wherein the second mount section is disposed adjacent to the second folding section and is at a same level as the second folding section.

4. The semiconductor package of claim 3, wherein the second semiconductor chip is disposed on one side of the first folding section and is disposed on one side of the second folding section, and the second semiconductor chip does not overlap either the first folding section or the second folding section.

5. The semiconductor package of claim 3, wherein the plurality of connection pads is disposed on the first mount section.

6. The semiconductor package of claim 1, wherein the first mount section is disposed on the first folding section, and the first mount section vertically overlaps the first folding section, and wherein the second mount section is disposed below the second folding section, and the second mount section vertically overlaps the second folding section.

7. The semiconductor package of claim 1, wherein a first surface of the first mount section, a second surface of the second mount section, and a third surface of the first and second folding sections together constitute a front surface of the base film, and wherein the first semiconductor chip is disposed on the first surface, the second semiconductor chip is disposed on the second surface, and the plurality of test pads is disposed on the third surface.

8. The semiconductor package of claim 7, wherein the connection pads are disposed on the first surface or the second surface.

9. The semiconductor package of claim 1, further comprising the passivation layer disposed on the base film, the passivation layer covering the first folding section and the second folding section, wherein the passivation layer includes:
   a first part disposed on the first folding section; and
   a second part disposed on the second folding section, and
      wherein the first part and the second part of the passivation layer are in contact with each other.

10. The semiconductor package of claim 9, wherein the plurality of test pads is disposed on the first folding section, wherein the first part of the passivation layer exposes the plurality of test pads, and wherein the second part of the passivation layer covers the plurality of test pads, or the plurality of test pads is disposed on the second folding section, wherein the second part of the passivation layer exposes the plurality of test pads, and wherein the first part of the passivation layer covers the plurality of test pads.

11. The semiconductor package of claim 1, wherein the first semiconductor chip, the second semiconductor chip, the plurality of test pads, and the connection pads are disposed on a front surface of the base film, and wiring lines, semiconductor chips, and pads are not disposed on a rear surface of the base film, wherein the rear surface being opposite to the front surface.

12. A semiconductor package, comprising:
   a base film having a first mount surface, a folding surface, and a second mount surface that are sequentially arranged, the first mount surface, the folding surface, and the second mount surface together constituting a front surface of the base film;
   a first semiconductor chip disposed on the first mount surface of the base film;
   a second semiconductor chip disposed on the second mount surface of the base film;
   a plurality of connection patterns to which the first and second semiconductor chips are connected along the front surface of the base film;
   a plurality of test pads disposed on the folding surface of the base film;

a plurality of test patterns through which the first and second semiconductor chips and the plurality of test pads are connected along the front surface of the base film; and a passivation layer disposed on the front surface of the base film, the passivation layer covering the plurality of connection patterns and the plurality of test patterns, wherein the folding surface has a first folding surface adjacent to the first mount surface and a second folding surface adjacent to the second mount surface, wherein the base film is folded such that the first folding surface and the second folding surface face each other and the first folding surface and the first mount surface are arranged in opposite directions, and wherein, on the first mount surface, the passivation layer exposes end portions of each of the plurality of connection patterns.

13. The semiconductor package of claim 12, wherein the first mount surface is disposed on the first folding surface and vertically overlaps the first folding surface, and the second mount surface is disposed adjacent to the second folding surface, the second mount surface and the second folding surface being on a common plane.

14. The semiconductor package of claim 12, wherein the base film is folded such that the second folding surface and the second mount surface are arranged in opposite directions, and the second mount surface is disposed below and vertically overlaps the second folding surface.

15. The semiconductor package of claim 12, wherein the plurality of test pads is disposed between the first folding surface and the second folding surface and is buried by the passivation layer.

16. The semiconductor package of claim 12, wherein the plurality of test pads is disposed on the first folding surface or the second folding surface, and the passivation layer exposes the plurality of test pads.

17. The semiconductor package of claim 12, wherein a first part and a second part of the passivation layer are in contact with each other, the first part of the passivation layer is disposed on the first folding surface, and the second part of the passivation layer is disposed on the second folding surface.

* * * * *